United States Patent
Hu et al.

(10) Patent No.: US 9,754,684 B2
(45) Date of Patent: Sep. 5, 2017

(54) COMPLETELY UTILIZING HAMMING DISTANCE FOR SECDED BASED ECC DIMMS

(71) Applicant: Samsung Electronics Co., Ltd., Suwon-si, Gyeonggi-do (KR)

(72) Inventors: Chaohong Hu, San Jose, CA (US); Hongzhong Zheng, Sunnyvale, CA (US); Prashant Jayaprakash Nair, Mumbai (IN)

(73) Assignee: SAMSUNG ELECTRONICS CO., LTD. (KR)

( * ) Notice: Subject to any disclaimer, the term of this patent is extended or adjusted under 35 U.S.C. 154(b) by 140 days.

(21) Appl. No.: 14/640,005

(22) Filed: Mar. 5, 2015

(65) Prior Publication Data

US 2016/0134307 A1 May 12, 2016

Related U.S. Application Data

(60) Provisional application No. 62/076,477, filed on Nov. 6, 2014.

(51) Int. Cl.
| | |
|---|---|
| *H03M 13/00* | (2006.01) |
| *G11C 29/52* | (2006.01) |
| *H03M 13/19* | (2006.01) |
| *G06F 11/10* | (2006.01) |
| *G11C 29/04* | (2006.01) |

(52) U.S. Cl.
CPC .......... *G11C 29/52* (2013.01); *G06F 11/1048* (2013.01); *H03M 13/19* (2013.01); *G11C 2029/0411* (2013.01)

(58) Field of Classification Search
CPC ............... G06F 11/1068; H03M 13/19; G11C 2029/0411; G11C 29/52
See application file for complete search history.

(56) References Cited

U.S. PATENT DOCUMENTS

| | | | |
|---|---|---|---|
| 5,978,370 A * | 11/1999 | Shively .............. | H04B 7/18515 370/370 |
| 7,949,931 B2 | 5/2011 | Lastras-Montano | |
| 8,010,875 B2 | 8/2011 | Gara et al. | |
| 8,041,990 B2 | 10/2011 | Lastras-Montano et al. | |
| 2007/0101238 A1* | 5/2007 | Resnick ................ | G06F 11/106 714/763 |

(Continued)

*Primary Examiner* — Guy Lamarre
(74) *Attorney, Agent, or Firm* — Renaissance IP Law Group LLP (57) ABSTRACT

In an Error Correction Code (ECC)-based memory, a Single Error Correction Double Error Detection (SECDED) scheme is used with data aggregation to correct more than one error in a memory word received in a memory burst. By completely utilizing the Hamming distance of the SECDED (128,120) code, 8 ECC bits can potentially correct one error in 120 data bits. Each memory burst is effectively "expanded" from its actual 64 data bits to 120 data bits by "sharing" additional 56 data bits from all of the other related bursts. When a cache line of 512 bits is read, the SECDED (128,120) code is used in conjunction with all the received 64 ECC bits to correct more than one error in the actual 64 bits of data in a memory word. The data mapping of the present disclosure translates to a higher rate of error correction than the existing (72,64) SECDED code.

19 Claims, 5 Drawing Sheets

(56) References Cited

U.S. PATENT DOCUMENTS

| | | | |
|---|---|---|---|
| 2009/0063934 A1* | 3/2009 | Jo ..................... | G06F 11/1068 714/764 |
| 2010/0257432 A1* | 10/2010 | Resnick ............. | G06F 11/1008 714/777 |
| 2012/0166904 A1* | 6/2012 | Bandholz ........... | G06F 11/1048 714/746 |
| 2014/0063983 A1 | 3/2014 | Daly | |
| 2014/0351673 A1* | 11/2014 | Ware ................... | G11C 29/785 714/764 |

\* cited by examiner

COMPLETELY UTILIZING HAMMING DISTANCE FOR SECDED BASED ECC DIMMS

CROSS-REFERENCE TO RELATED APPLICATION

This application claims the priority benefit under 35 U.S.C. §119(e) of U.S. Provisional Application No. 62/076,477 filed on Nov. 6, 2014, the disclosure of which is incorporated herein by reference in its entirety.

TECHNICAL FIELD

The present disclosure generally relates to memories. More particularly, and not by way of limitation, particular embodiments of the inventive aspects disclosed in the present disclosure are directed to a memory data error correction scheme that uses Single Error Correction Double Error Detection (SECDED) based (128,120) SECDED code and data aggregation to correct more than one error in a 64-bit data burst from the memory.

SUMMARY

Current Error Correcting Code (ECC) based Dual In-Line Memory Modules (DIMMs) store extra bits, known as ECC bits, on the memory module itself to enable the system memory controller to detect and correct errors in the actual data stored in the ECC-DIMM. Such error detection and correction is implemented with the aim to preserve the integrity of the stored data. However, existing ECC-capable memory controllers typically implement codes like SECDED—a (72,64) Hamming code—that allows the controller to detect and correct errors of a single bit per 64-bit memory word, and detect (but not correct) errors of two bits per 64-bit word. Thus, a controller's ability to manage data integrity is significantly limited—to correction of just a single bit of data in a 64-bit word. Although an ECC-DIMM stores 8 ECC bits per 64 data bits, the resulting single bit error correction capability is not very efficient and begs for improvement.

Hence, it is desirable to improve the error correction performance of the existing memory controllers without modifying the current allocation of 8 ECC bits per 64 data bits in an ECC-DIMM. It is further desirable to be able to correct more than one error in a 64-bit memory word using a SECDED based scheme so as to be able to utilize existing SECDED circuitry in a memory controller, thereby avoiding the requirement for additional complex circuitry.

In particular embodiments of the present disclosure, data aggregation is used along with SECDED coding to correct errors at higher efficiency. By completely utilizing the Hamming distance of the (128,120) SECDED code, 8 ECC bits can be used to potentially correct one error in 120 data bits. Hence, in one embodiment, 8 ECC bits are associated with not only their corresponding 64 data bits, but also with an additional 56 data bits from other memory bursts so as to have a total of 120 data bits per 8 bits of ECC. Each burst from the ECC-DIMM remains at 72 bits—64 data bits plus 8 bits of ECC. However, the memory controller (or the host processor) may be configured to "overlap" 56 data bits from multiple different bursts with the 64 data bits of a given burst so as to apply the 8 ECC bits of the given burst to these 120 data bits. In other words, each memory burst may be effectively "expanded" from its actual (or "original") 64 data bits to 120 data bits by "sharing" data bits from all of the other bursts for a cache line being read from an ECC-DIMM; the number of ECC bits associated with the burst still remains the same—8 bits. In the case of 64 ECC bits for a 512-bit cache line, when each memory word/burst is effectively expanded in this manner, the memory controller (or the host processor) may use the SECDED code in conjunction with all the received 64 ECC bits to correct more than one error in the actual 64 bits of data in a memory word.

In one embodiment, the present disclosure is directed to a method that comprises: (i) receiving a burst-specific content from each burst in a plurality of bursts from a memory module, wherein the burst-specific content includes a pre-determined number of bits of burst-specific data along with corresponding bits of burst-specific Error Correcting Code (ECC); (ii) storing the burst-specific content from each burst in the plurality of bursts; and (iii) using all received ECC bits as part of a SECDED code to correct more than one error in the pre-determined number of bits of burst-specific data from at least one of the plurality of bursts. In one embodiment, the SECDED code is a SECDED (128,120) code.

In another embodiment, the present disclosure is directed to a memory controller that comprises a control unit; a buffer coupled to the control unit; and a decoder coupled to the buffer and the control unit. In the memory controller, the buffer is operative by the control unit to: (i) receive a burst-specific content from each burst in a plurality of bursts from a memory module, wherein the burst-specific content includes a pre-determined number of bits of burst-specific data along with corresponding bits of burst-specific ECC, and (ii) store the burst-specific content from each burst in the plurality of bursts. In the memory controller, the decoder unit is operative by the control unit to use all received ECC bits as part of a SECDED (128,120) code to correct more than one error in the pre-determined number of bits of burst-specific data from at least one of the plurality of bursts.

In yet another embodiment, the present disclosure is directed to a system that comprises: (i) a memory module configured to store electronic content; (ii) a memory controller coupled to the memory module and configured to control storage and retrieval of the electronic content to/from the memory module; and (iii) a processor coupled to the memory controller and configured to perform a memory read operation on the memory module using the memory controller. In the system, as part of the memory read operation, the memory controller is operative to perform the following: (i) receive a burst-specific content from each burst in a plurality of bursts from the memory module, wherein all bursts in the plurality of bursts together comprise the memory read operation, and wherein the burst-specific content includes a pre-determined number of bits of burst-specific data along with corresponding bits of burst-specific ECC, (ii) store the burst-specific content from each burst in the plurality of bursts, (iii) use all received ECC bits as part of a SECDED (128,120) code to correct more than one error in the first pre-determined number of bits of burst-specific data from at least one of the plurality of bursts, and (iv) subsequently transfer all the pre-determined number of bits of burst-specific data to the processor.

In a further embodiment, the present disclosure is directed to a system that comprises: (i) a memory module configured to store electronic content; and (ii) a processor coupled to the memory module and configured to perform a memory read operation on the memory module. In the system, as part of the memory read operation, the processor is operative to perform the following: (i) receive a burst-specific content from each burst in a plurality of bursts from the memory module, wherein all bursts in the plurality of bursts together comprise the memory read operation, and wherein the burst-specific content includes a first pre-determined number of bits of burst-specific data along with corresponding bits of burst-specific ECC, (ii) store the burst-specific content from each burst in the plurality of bursts, and (iii) use all received ECC bits as part of a SECDED (128,120) code to correct more than one error in the first pre-determined number of bits of burst-specific data from at least one of the plurality of bursts. As part of using all the received ECC bits, the processor is further operative to perform the following for each burst in the plurality of bursts: (i) select a burst-specific second pre-determined number of bits of data from all other bursts in the plurality of bursts, wherein a total of the first pre-determined number of bits and the second pre-determined number of bits is at least 120, and (ii) apply the bits of burst-specific ECC to the corresponding first pre-determined number of bits of burst-specific data as well as to the burst-specific second pre-determined number of bits of data.

Thus, particular embodiments of the present disclosure provide for a data storage and retrieval scheme that can correct more than one error in a memory word using SECDED coding along with data aggregation. The SECDED (128,120) coding utilizes its full Hamming distance with overlapping data layers to correct multiple errors in a 64-bit memory burst. In particular embodiments, the methodology according to the teachings of the present disclosure may correct a higher number of errors per memory burst than a Six Error Correction Seven Error Detection (6EC7ED) scheme, sometimes without requiring any additional complex circuitry. The data mapping according to the teachings of the present disclosure may translate to a higher resilience or error correction than the existing (72,64) SECDED code. Furthermore, the error correction methodology according to particular embodiments of the present disclosure does not require implementation of a new code and, hence, existing SECDED circuitry in a memory controller may be effectively used.

BRIEF DESCRIPTION OF THE DRAWINGS

In the following section, the inventive aspects of the present disclosure will be described with reference to exemplary embodiments illustrated in the figures, in which.

DETAILED DESCRIPTION

In the following detailed description, numerous specific details are set forth in order to provide a thorough understanding of the disclosure. However, it will be understood by those skilled in the art that the disclosed inventive aspects may be practiced without these specific details. In other instances, well-known methods, procedures, components and circuits have not been described in detail so as not to obscure the present disclosure. Additionally, it should be understood that although the disclosure is described primarily in the context of a SECDED-based ECC-DIMM with 64-bit data bus, the described inventive aspects can be implemented to correct/manage errors in other types of memories as well.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" or "according to one embodiment" (or other phrases having similar import) in various places throughout this specification are not necessarily all referring to the same embodiment. Furthermore, the particular features, structures, or characteristics may be combined in any suitable manner in one or more embodiments. Also, depending on the context of discussion herein, a singular term may include its plural forms and a plural term may include its singular form. Similarly, a hyphenated term (e.g., "SECDED-based," "pre-determined", "burst-specific," etc.) may be occasionally interchangeably used with its non-hyphenated version (e.g., "SECDED based," "pre-determined", "burst specific," etc.), and a capitalized entry (e.g., "Memory Controller," "Control Unit," etc.) may be interchangeably used with its non-capitalized version (e.g., "memory controller," "control unit," etc.). Such occasional interchangeable uses shall not be considered inconsistent with each other.

It is noted at the outset that the terms "coupled," "operatively coupled," "connected", "connecting," "electrically connected," etc., are used interchangeably herein to generally refer to the condition of being electrically/electronically connected in an operative manner. Similarly, a first entity is considered to be in "communication" with a second entity (or entities) when the first entity electrically sends and/or receives (whether through wireline or wireless means) information signals (whether containing address, data, or control information) to/from the second entity regardless of the type (analog or digital) of those signals. It is further noted that various figures (including component diagrams) shown and discussed herein are for illustrative purpose only, and are not drawn to scale.

The terms "first," "second," etc., as used herein, are used as labels for nouns that they precede, and do not imply any type of ordering (e.g., spatial, temporal, logical, etc.) unless explicitly defined as such.

Figure 1:
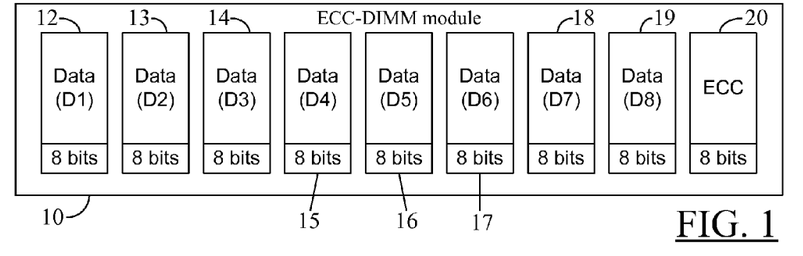
FIG. 1 shows a highly simplified layout of an ECC-DIMM module.

FIG. 1 shows a highly simplified layout of an ECC-DIMM module 10. As shown, the ECC-DIMM module 10 includes eight memory chips 12-19 for storing data bits and one ECC chip 20 for storing check bits or parity bits (also referred to as "ECC bits") for the specific error correction code chosen to provide error correction for the data bits in the memory chips 12-19. The eight data chips are designated as chips "D1" through "D8." The chip numbers provided here are for ease of reference only; they do not indicate any specific order or priority among the chips. Rather, as is understood, each data chip D1-D8 may receive or output its corresponding data content substantially simultaneously with other data chips. As shown in FIG. 1, each chip 12-20 in the DIMM 10 may transfer a corresponding eight (8) bits of content in a single memory access or "burst." For the data chips 12-19, such "content" is the data being read/stored, whereas for the ECC chip 20, such "content" is the ECC bits corresponding to the total of 64 data bits (8 bits per data chip) being transferred to/from the data chips D1 through D8 during a single memory access. Thus, the "width" of each memory burst to/from the DIMM 10 would be 72 bits. Each chip 12-20 in the ECC-DIMM may be a Synchronous Dynamic Random Access Memory (SDRAM) such as, for example, a Double Data Rate or Double Data Rate 2, 3, or 4 SDRAM (DDR/DDR2/DDR3/DDR4 SDRAM). Furthermore, each data chip 12-19 may have the same storage capacity such as, for example, 512 mega bits (Mb), making the DIMM 10 a 512 mega byte (MB) memory module. In this case, the ECC chip 20 also will contain 512 Mb of storage. In any event, the storage capacity or internal configuration of memory banks within a chip 12-20 are not relevant to the present disclosure and, hence, additional details thereof are not provided.

In the discussion herein, the terms "memory word" or "data world" are used to refer to the total number of data bits transferred to/from an ECC-DIMM per memory burst. The ECC bits associated with the memory burst are not counted as part of the term "memory word." Thus, in case of the ECC-DIMM 10 in FIG. 1, the memory word would be 64 bits wide—8 bits of data per data chip per burst, even if the total number of bits per burst is 72 bits (64 bits of data+ corresponding 8 ECC bits). Furthermore, the terms "memory burst" or "burst" are used herein to refer to a single access in a group of consecutive accesses to an ECC-DIMM, wherein each single access or "burst" transfers a pre-determined number of bits of burst-specific data along with corresponding 8 bits of burst-specific ECC to/from the ECC-DIMM. For example, it is understood that data is generally transferred between an external memory—such as, for example, the ECC-DIMM 10 in FIG. 1—and a processor's cache memory in blocks of fixed size, called "cache lines". Modern microprocessors support a cache line of 512 bits (or 64 bytes). Thus, to transfer a 64-byte cache line, the memory controller may need to perform 8 consecutive accesses or "bursts" when a DIMM's memory word is 64 bits long. All of such bursts can be triggered by a single read or write command to the memory. For example, in case of a memory read operation on the ECC-DIMM 10 for a single cache line, there would be 8 consecutive bursts of content resulting in an output of a total of 512 bits of data (for the cache line) and 64 bits of ECC. In each burst, each chip 12-20 would substantially simultaneously output corresponding 8 bits of burst-specific data or ECC content as shown, for example, in FIG. 2.

It is seen from FIG. 1 that the ECC-DIMM 10 contains extra bits of content—in the form of ECC bits (as in chip 20)—which can be used by the system memory controller to detect and correct errors in the corresponding data bits. There are numerous ECC schemes, but Hamming code-based ECC schemes are more popular for computer memories where bit errors are rare. Due to the limited redundancy that Hamming codes add to the underlying data, these codes can only detect and correct errors when the error rate is low, as in the case of computer memories. Generally, a Hamming code with the Hamming distance of 3 allows detection and correction of a single error, but does not allow a decoder to also distinguish a double bit error of some codeword from a single bit error of a different codeword. Thus, in this case, the decoder can detect a double-bit error only if it does not simultaneously attempt to correct another single bit error. However, when such a Hamming code is extended by an extra parity bit, it is possible to increase the minimum Hamming distance of the code to 4, which allows the decoder to not only detect and correct a single bit error, but also to simultaneously detect (but not correct) a double bit error. This extended Hamming code is popularly used for preserving data integrity in computer memory systems, where it is known as the Single Error Correction Double Error Detection (SECDED) code. Using the SECDED code and an extra 8 bits of ECC, an ECC-capable memory controller in modern computers can typically detect and correct errors of a single bit per 64-bit memory word.

The SECDED code is a sub-class of Hamming codes, which are linear error-correcting codes. More generally, an (n, k) binary Hamming code encodes "k" bits of data into a code word of "n" bits (n>k). The "n" total bits contain the "k" data bits as well as "n−k" check bits or ECC bits. Mathematically, a binary Hamming code has the property that (n, k)=($2^m-1$, $2^m-1-m$), where "m" is any positive integer representing the check bits or parity bits of the code. Thus, the value of m=7 results in the (127,120) Hamming code. The SECDED code is an extended version of the Hamming code with an additional parity bit appended to each code word. Thus, in the m=7 example here, the SECDED code would include m+1=8 parity or ECC bits and 120 data bits. Such a SECDED code may be referred to as the SECDED (128,120) code.

Current memory controllers or other units implementing ECC in computer systems or processors use a (72,64) SECDED code, which is a truncated version of the (128, 120) Hamming code with an additional parity bit. The (72,64) SECDED code requires 8 ECC bits per 64 data bits, and is used because of the need to align with the typical 64 data bit bus in computer systems.

Given any two different code words in a Hamming code, the term "Hamming distance" refers to the number of corresponding elements or positions in which these two code words differ. Thus, Hamming distance provides a measure of the separation between pairs of code words. For example, as mentioned earlier, the Hamming distance of the (72,64) Hamming code is 4. Similarly, the Hamming distance of the SECDED (128,120) code is also 4.

Figure 2:
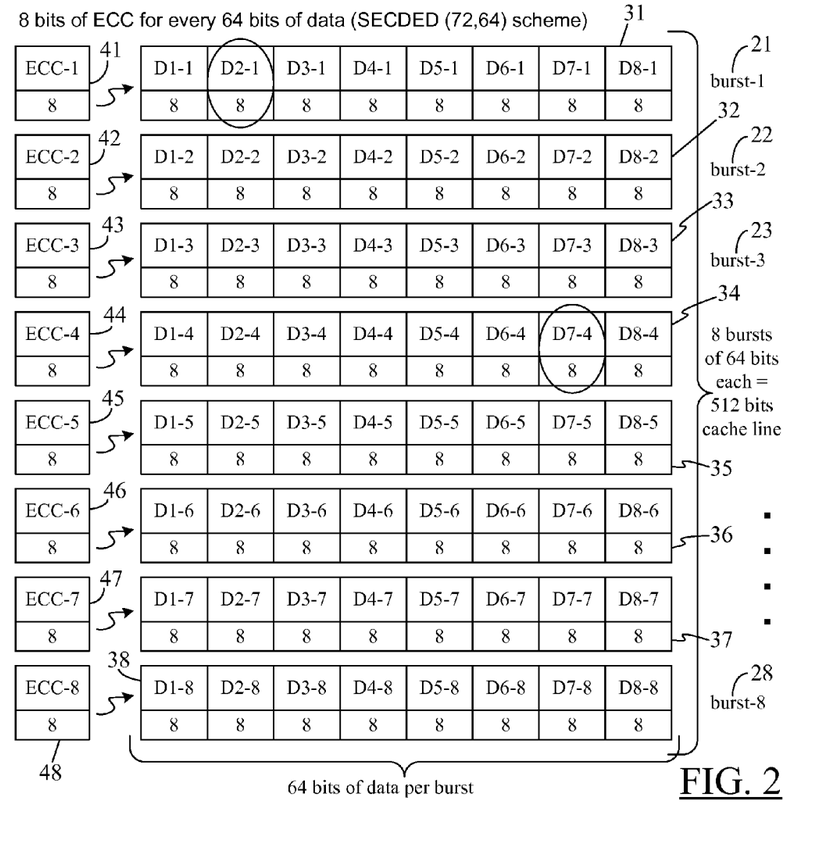
FIG. 2 depicts an example of the conventional error correction mechanism for data bursts from an ECC-DIMM.

FIG. 2 depicts an example of the conventional error correction mechanism for data bursts from an ECC-DIMM, such as the ECC-DIMM 10 in FIG. 1. In FIG. 2, eight bursts 21-28 of memory content are shown, for example, in the context of reading a cache line of 512 data bits from the memory. As shown in FIG. 2, each burst 21-28 contains a respective burst-specific data portion 31-38 and a respective burst-specific ECC bits 41-48. For example, the first burst 21 contains the data portion 31 and the ECC bits 41, the second burst 22 contains the data portion 32 and the ECC bits 42, and so on. Each burst-specific data portion contains 8 bits of data from each of the eight data chips D1 through D8 shown in FIG. 1. Thus, each burst contains 64 bits of data and corresponding 8 bits of ECC, which results in a total of 512 bits of data and 64 bits of ECC for the exemplary memory read operation illustrated in FIG. 2.

Figure 6:
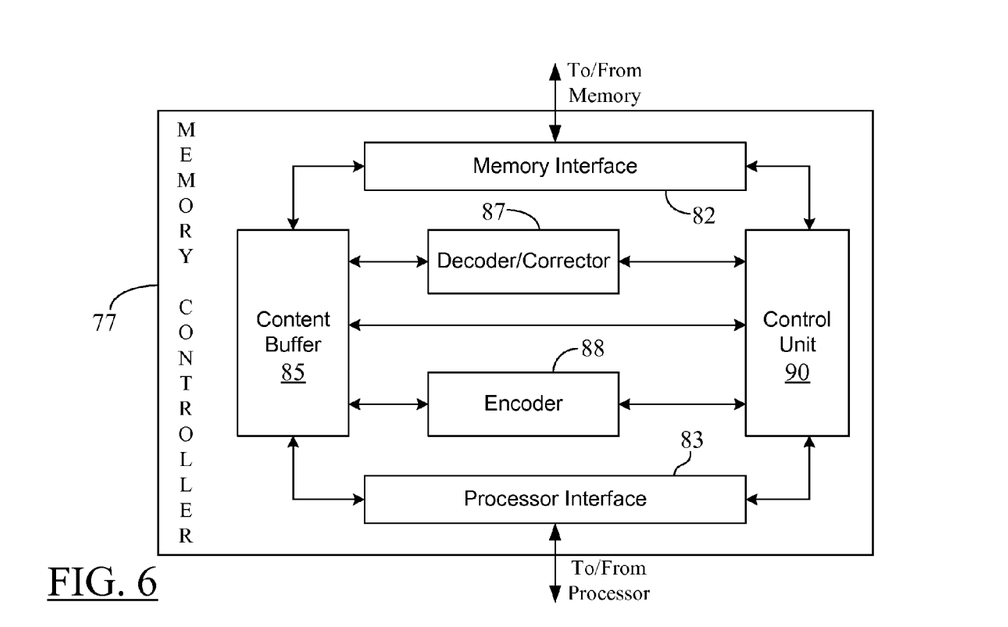
FIG. 6 shows exemplary architectural details of the memory controller depicted in the partial system configuration of FIG. 5.

In the context of FIGS. 2 and 6, the following nomenclature is used: (i) The burst-specific data from each data chip D1-D8 12-19 is designated by the chip number followed by the burst number. Thus, for example, "D1-1" indicates 8 bits of data from chip D1 for the first burst 21, "D2-1" indicates 8 bits of data from chip D2 for the first burst 21, "D4-3" indicates 8 bits of data from chip D4 for the third burst 23, "D8-8" indicates 8 bits of data from chip D8 for the eighth burst 28, and so on. (ii) The burst-specific 8 bits of ECC from the chip 20 are designated by the letters "ECC" followed by the burst number. Thus, for example, "ECC-1" refers to 8 ECC bits for the first burst 21, "ECC-3" refers to 8 ECC bits for the third burst 23, and so on.

The illustration in FIG. 2 assumes a (72,64) SECDED scheme for ECC—i.e., 8 bits of ECC for every 64 bits of data. It is assumed in FIG. 2 that there is no error in the ECC bits 41-48 output from the DIMM 10. Thus, the SECDED scheme in FIG. 2 would allow for correction of a single error and detection of two errors in each 64-bit data portion per burst. For example, using ovals to symbolically illustrate erroneous data, FIG. 2 shows that the ECC-1 block 41 enables a memory controller or decoder to detect and correct a single error in the 8 bits of output D2-1 from chip D2, whereas the ECC-4 block 44 allows for detection and correction of another single error in the output D7-4 from chip D7 during the memory read operation discussed with reference to FIG. 2.

However, as noted before, the current (72, 64) SECDED scheme of error correction does not allow for correction of more than one error per data word in a memory burst. On the other hand, as discussed below, more than one error per data burst can be corrected using the SECDED based error correction in conjunction with data aggregation according to particular embodiments of the present methodology.

Figure 3:
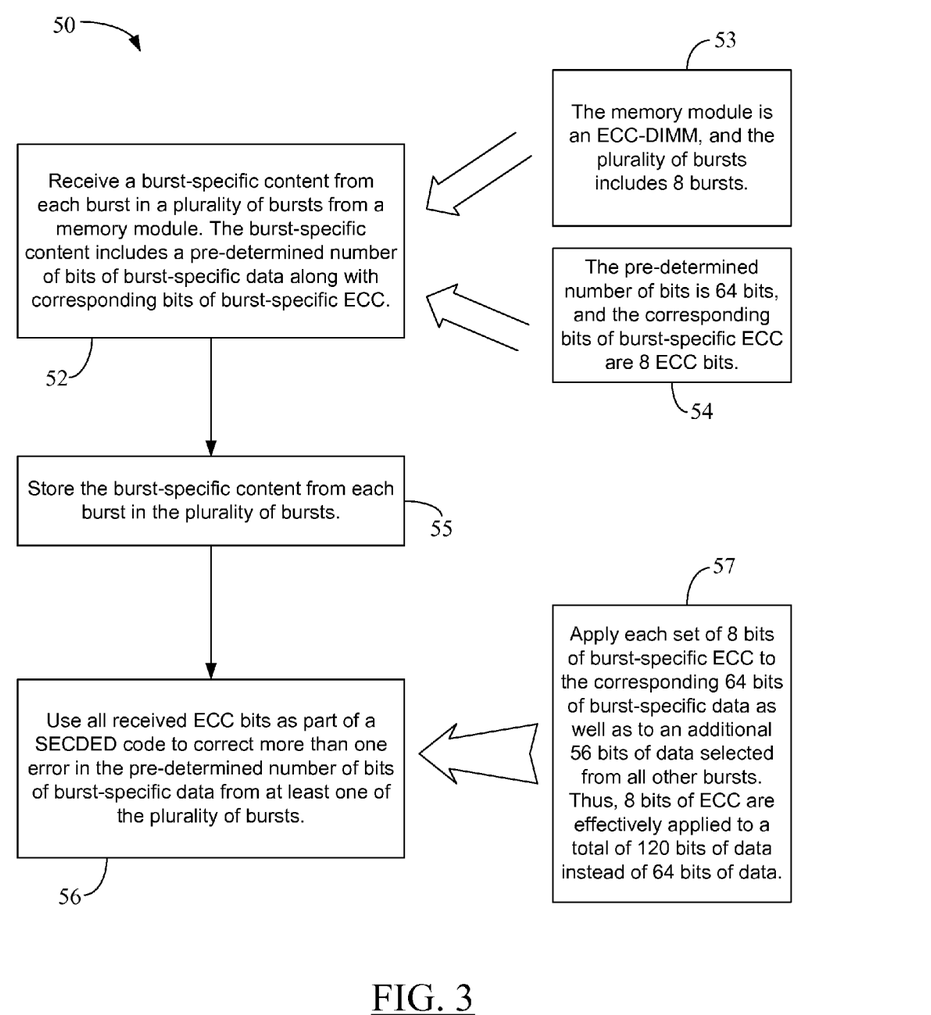
FIG. 3 illustrates an exemplary flowchart showing how multiple errors in a single burst from an ECC-DIMM may be corrected using a SECDED based scheme according to one embodiment of the present disclosure.
Figure 4:
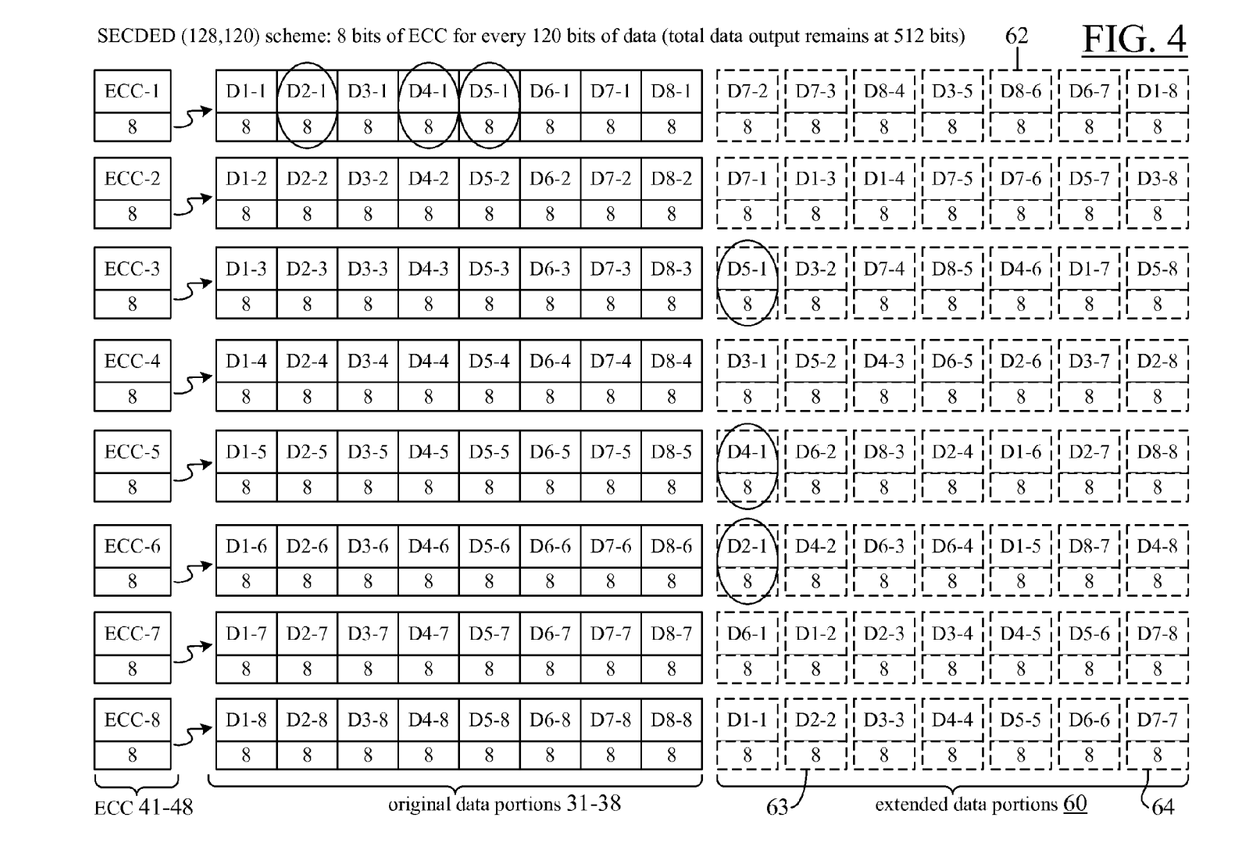
FIG. 4 shows an example of how multiple errors may be corrected in a single burst of data using the methodology illustrated in FIG. 3.

FIG. 3 illustrates an exemplary flowchart 50 showing how multiple errors in a single burst from an ECC-DIMM, such as the ECC-DIMM 10 in FIG. 1, may be corrected using a SECDED based scheme according to one embodiment of the present disclosure. FIG. 4 provides a detailed example to explain the methodology in FIG. 3. The embodiments in FIGS. 3-4 relate to a memory read operation. However, it is understood that the methodology illustrated in FIGS. 3-4 may be easily implemented for a memory write operation as well.

Figure 5:
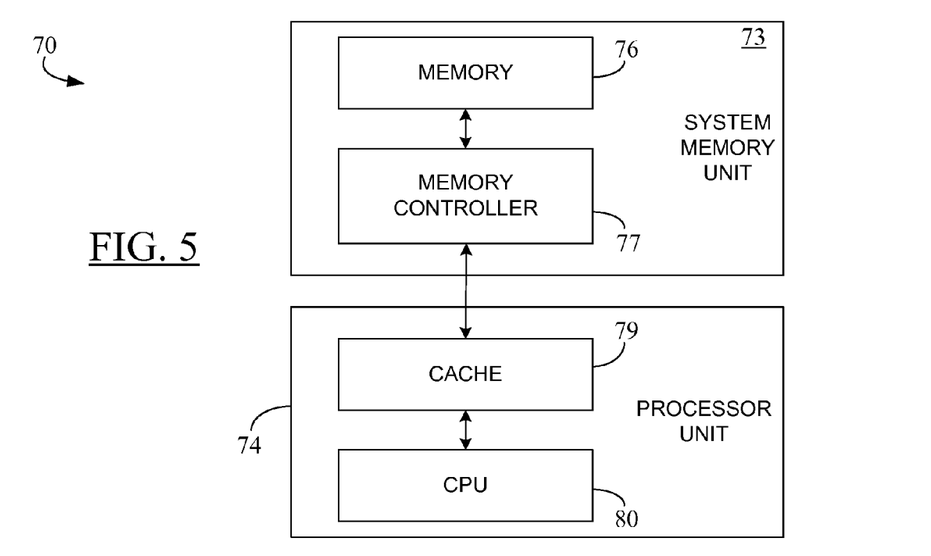
FIG. 5 illustrates an exemplary partial system configuration in which the error correction methodology shown in the embodiments of FIGS. 3-4 may be implemented.

The methods illustrated in the embodiments of FIGS. 3-4 may be implemented in a memory controller, such as the memory controller 77 shown in FIGS. 5-6. In another embodiment, the ECC-DIMM 10 itself may be configured to include an on-chip error correction unit (not shown) configured to implement the methodologies of FIGS. 3-4. In a further embodiment, a Central Processing Unit (CPU) such as the CPU 80 in FIG. 5 or a processor unit, such as the processor unit 74 in FIGS. 5 and 7, may be configured to implement the error correction schemes in the embodiments of FIGS. 3-4. Alternatively, in particular embodiments, a combination of these approaches may be used to implement the steps illustrated in FIG. 3 and discussed further with reference to FIG. 4. However, for ease of discussion and as a non-limiting example, the methods in FIGS. 3-4 are primarily described below as being performed by a memory controller.

As noted at block 52 in FIG. 3, as part of a memory read operation to read a cache line of 512 data bits, the memory controller or other suitable entity (as mentioned above) may receive burst-specific content from each burst in a plurality of bursts constituting the memory read operation. As discussed before and as noted at block 53, the memory module providing the bursts may be an ECC-DIMM, such as the ECC-DIMM 10, and the memory read operation may be accomplished using 8 bursts from the memory. The burst-specific content for each burst may include a pre-determined number of bits of burst-specific data along with corresponding bits of burst-specific ECC. Thus, as noted at block 54, in case of a cache line, the pre-determined number is 64 bits (each of the 8 bursts providing 64 bits of data in the 512 bit cache line) and the corresponding bits of burst-specific ECC are 8 bits of ECC. At block 55, the memory controller may store the burst-specific content—including data and ECC bits—from each burst in the plurality of bursts at block 52. In one embodiment, the memory controller may include a content buffer, such as the content buffer 85 shown in FIG. 6, for such storage. At block 56, the memory controller may use all of the received 64 ECC bits as part of a SECDED code such as, for example, the earlier-mentioned SECDED (128,120) code, to correct more than one error in the burst-specific data bits from at least one of the plurality of bursts. Thus, as indicated at block 57 and discussed in more detail with reference to FIG. 4, in one embodiment, the memory controller may use the SECDED (128,120) code to apply each set of 8 bits of burst-specific ECC to the corresponding 64 bits of burst-specific data as well as to an additional 56 bits of data selected from all the other bursts in the plurality of bursts. Thus, in contrast to the SECDED (72,64) based existing error correction illustrated with reference to FIG. 2, the error correction in the embodiment of FIG. 3 effectively applies 8 bits of ECC to a total of 120 bits of data instead of 64 bits of data. In this manner, the hamming distance of the (128,120) SECDED code is fully utilized to correct 2 to 7 errors in a memory word as further described below.

Because the current SECDED (72,64) scheme is a truncated version of the (128,120) Hamming code, the (72,64) SECDED scheme results in under-provisioning or under-utilization of ECC Hamming distance because the (72,64) SECDED scheme does not fully utilize its Hamming distance of "4" to operate on the maximum number of data bits supported by that Hamming distance. The SECDED code that can support the maximum number of data bits with the Hamming distance of "4" is the SECDED (128,120) code, where 8 ECC bits can potentially correct one error in 120 data bits, instead of just 64 data bits as in case of the SECDED (72,64) scheme. Thus, by extending the striping of data and by completely using the available Hamming distance of the (72,64) SECDED scheme to support the maximum SECDED capability of 120 data bits, more than one error in at least one data word may be corrected as further discussed below with reference to FIG. 4.

FIG. 4 shows an example of how multiple errors may be corrected in a single burst of data using the methodology illustrated in FIG. 3. For ease of comparison and discussion, the nomenclature used in conjunction with FIG. 2 is continued in FIG. 4. Also for ease of comparison and discussion, FIG. 4 reproduces the burst configuration in FIG. 2 to clearly contrast the traditional error correction approach of FIG. 2 with the error correction methodology according to particular embodiments of the present disclosure. However, such reproduction in FIG. 4 does not imply that the error correction approach in FIG. 2 is a pre-requisite step for the error correction in FIG. 4, or that the error correction approach in FIG. 4 requires the same burst outputs as those shown in FIG. 2. The use of identical information in FIGS. 2 and 4 is for illustrative purpose only, and does not imply any similarity of content or approach between the configurations in FIGS. 2 and 4.

Referring now to FIG. 4, it is observed that a codeword in the embodiment of FIG. 4 is formed as a combination of an original data portion, an extended data portion 60, and an ECC portion. In contrast, no such extended data portion is present or applicable in the error correction scheme of FIG. 2. In FIG. 4, for ease of discussion as noted before, the original data portion for each burst is shown to be the same as that in FIG. 2 and, hence, is collectively identified using the same reference numerals "31" through "38." Similarly, the original ECC blocks 41-48 in FIG. 2 are also shown using the same reference numerals in FIG. 4 along with corresponding burst-specific data words 31-38. To avoid complexity of the drawing and clutter, each individual block in FIG. 4 is not separately identified using a reference numeral—as was the case in FIG. 2. Hence, the reference numeral "60" is used to collectively identify all the bytes of data in each burst that are not part of the original data portion for that burst. For the sake of illustration, three such data bytes 62-64 in the extended data portions 60 are specifically identified in FIG. 4. Also, to clearly distinguish them from the original burst-specific data, the burst-specific extended data bytes are shown using broken lines.

It is noted here that the memory controller still receives only 512 bits of data—64 data bits per burst—in the memory read operation discussed with reference to FIG. 3. However, a data arrangement like the one shown in FIG. 4 may be accomplished by the memory controller once all the received 512 bits of data and 64 bits of ECC are stored in a buffer, such as the buffer 85 in FIG. 6. In other words, the ECC-DIMM 10 only outputs the ECC bits 41-48 and the original data portions 31-38 for a cache line read operation. The extended data portions 60 may be formed—for example, through data aggregation or overlap—by the memory controller in a buffer or another storage to generate the 128-bit codeword for each burst so as to be able to apply the (128,120) SECDED scheme as per teachings of particular embodiments of the present disclosure.

In one embodiment, the extended data portion for each burst may include a pre-determined number of bits of data selected from the original burst-specific data in all of the other bursts. Thus, for example, as shown in FIG. 4, the extended data portion for the first burst 21 may include a data byte from the second burst 22 (the D7-2 block), a data byte from the third burst 23 (the D7-3 block), a data byte from the fourth burst 24 (the D8-4 block), and so on. Similarly, the extended data portion for the sixth burst is shown to include the data bytes D2-1, D4-2, D6-3, D6-4, D1-5, D8-7, and D4-8. Other burst-specific extended data portions may be similarly explained. Furthermore, in order to use the SECDED (128,120) code in one embodiment, the memory controller may select 120−64=56 bits as the pre-determined number of bits in each burst-specific extended data portion. In one embodiment, for each burst in the plurality of bursts 21-28, the memory controller may select an identical number of bits—here, 8 bits—from the original burst-specific data associated with each of the other bursts to generate these additional 56 bits of data. In FIG. 4, for ease of illustration, each data byte in the extended data portions 60 is shown to be from a single memory chip (D1, D2, D3, etc.) and single burst (D1-1, D1-2, etc). However, in one embodiment, such may not be the case—i.e., each data byte in a burst-specific extended data portion may include data bits from more than one memory chip, or data bits from multiple bursts.

For any one of the 8 bursts shown in FIG. 4, it is observed here that because the memory controller may select 8 bits of data from each of the 7 other bursts, there may be a total of 56 bits in the burst-specific extended data portion for a burst, as shown in FIG. 4. Those 56 bits, when added to the burst-specific 64-bit original data portion, would result in a total of 120 bits of data. The SECDED (128,120) code would then apply to these 120 bits of data. However, in one embodiment, if the burst-specific ECC bits are used as part of a SECDED (127,119) code, the memory controller may be configured to ignore or omit one bit of data in the total of 120 bits generated using the methodology in FIG. 4.

It is noted here that, in one embodiment, the memory controller may be configured to randomly select the data bytes—like the bytes 62-64—for the extended portions 60. In another embodiment, the memory controller may be configured to select these data bytes according to a specific algorithm or in a pre-determined manner. For better error correction, however, it may be preferable to avoid having a common data byte between two extended data portions. On the other hand, it is evident from FIG. 4 that the data bytes between two 128-bit codewords may overlap because a data byte from a codeword's original data portion may appear in another codeword's extended data portion. However, such overlap is possible without compromising the error correction capability of a SECDED code because of the complete utilization of the Hamming distance of the SECDED (128, 120) code in the embodiments of FIGS. 3-4.

FIG. 4 also illustrates how multiple errors in at least one data word can be corrected using a SECDED scheme. As in case of FIG. 2, it is assumed in FIG. 4 also that there is no error in the ECC bits 41-48—i.e., the blocks ECC-1 through ECC-8 in FIG. 4—received from the DIMM 10. On the other hand, just as an example, the received data word 31 (in the original data portion for the first burst) is assumed to contain three errors of single bit each. The ovals in the data word 31 indicate the locations of these errors. The ovals are for illustration purpose only, and the error locations are selected completely arbitrarily just for the sake of an example. Thus, one error is shown to be in the data byte D2-1, a second error is shown to be in the data byte D4-1, and a third error is shown to be in the data byte D5-1. In the absence of the error correction according to the teachings of the present disclosure, when the ECC-1 bits 41 are applied to the data word 31 using the traditional (72,64) SECDED scheme, the result may be correction of one of these three errors and detection—but, not correction—of the other two. However, in the error correction scheme of FIGS. 3-4, all three errors in the memory word or data burst 31 can be corrected because the error correction methodology implemented in the embodiments of FIGS. 3-4 may "separate" or "distribute" the erroneous data bytes in such a manner that no two erroneous bytes may appear within the same codeword of 128 bits. Because the erroneous bits are now distributed among multiple codewords, the SECDED (128, 120) scheme may be used to correct each individual bit error. Thus, as shown in FIG. 4, the bit error in the D2-1 byte may be detected and corrected by the ECC-6 bits 46, the bit error in the D4-1 byte may be detected and corrected by the ECC-5 bits 45, and the bit error in the D5-1 byte may be detected and corrected by the ECC-3 bits 43. As a result, all three bit errors in the data word 31 may be corrected, albeit using different ECC bits than the ECC-1 bits associated with the data word 31. Such correction of multiple errors in a data word is not possible in the existing SECDED (72,64) methodology discussed earlier with reference to FIG. 2.

It is seen from FIG. 4 that by having any two 128-bit codewords share at least one original data byte, a "backup" plan is created in which multiple bit errors in the original data portion of a burst-specific 128-bit codeword can be corrected using "backup" ECC bits from other codewords (more particularly, the extra correcting capability available from using the ECC of other code words). By creating the extended data portions 60, the memory controller effectively "distributes" the erroneous data of a single data word among extended data portions of other unaffected codewords whose respective ECC bits can then detect and correct 1 error each as per the SECDED approach.

It is observed here that the error correction approach illustrated in FIG. 4 may allow for correction of 2 to 7 bit errors in a single memory word or multiple bit errors in two or more memory words. For example, although not shown in FIG. 4, if the data word 31 were to have additional single bit errors in D1-1, D3-1, D6-1, and D7-1 (i.e., errors in addition to those shown in FIG. 4), then those errors also may be corrected using ECC-8, ECC-4, ECC-7, and ECC-2, respectively. Thus, in this example, a total of 7 errors in the data word 31 may be corrected. In this example, in addition to the error corrections, each of the ECC-2 through ECC-8 may also be able to detect (but not correct) another two errors, thereby providing detection of at least 14 additional errors. As an example of correction of multiple bit errors in two or more memory words, it is assumed that, in addition to the errors in D2-1, D4-1, and D5-1 as shown in FIG. 4, there are also single bit errors in D1-4 and D4-4 in data word 34. Although these additional errors are not marked by ovals in FIG. 4, it is seen from the data aggregation scheme in FIG. 4 that these additional single bit errors in D1-4 and D4-4 would be corrected using ECC-2 and ECC-8, respectively. Hence, multiple bit errors in data words 31 and 34 may not only be detected, but effectively corrected using the SECDED (128,120) scheme as per teachings of particular embodiments of the present disclosure.

From the discussion of FIGS. 3-4, it is observed that the error correction methodology according to particular embodiments of the present disclosure may correct higher number of errors per burst than the existing 6EC7ED scheme, sometimes without requiring any additional complex circuitry because of the possibility of continued use of the existing SECDED circuitry in a memory controller (or other appropriate error detection/correction unit). The errors may be corrected at higher efficiency because of the usage of SECDED and data aggregation in the manner discussed hereinbefore. Furthermore, even if the ECC bits 41-48 in FIG. 4 are based on a Bose Chaudhuri Hocquenghem-1 (BCH-1) code, the error correction methodology according to the teachings of the present disclosure may not require the memory controller (or other suitable entity) to implement another BCH code because the BCH-1 code can provide SECDED type protection and, hence, SECDED circuitry can be used for BCH-1 based codewords. Additionally, the SECDED (128,120) based error correction as per teachings of the present disclosure may have stronger Reliability Availability Serviceability (RAS) than the existing SECDED (72,64) based error correction schemes.

FIG. 5 illustrates an exemplary partial system configuration 70 in which the error correction methodology shown in the embodiments of FIGS. 3-4 may be implemented. In the system configuration 70, a system memory unit 73 is shown to be operatively connected to a processor unit 74. The memory unit 73 may include, among other components, at least one memory module 76 and a memory controller 77. On the other hand, the processor unit 74 may include a cache unit 79 and a Central Processing Unit (CPU) 80. In one embodiment, the memory controller 77 may be part of the processor unit 74 or the processor unit 74 may be configured to implement the functionality of the memory controller 77, whose constituent details are shown in the exemplary embodiment of FIG. 6. For ease of discussion, only a very simplified illustration of the units 73, 74 is provided in FIG. 5. It is understood that these units may contain many other complex components. However, such components are not illustrated in FIG. 5 because of their lack of relevance to the present disclosure.

In one embodiment, the memory module 76 may comprise of one or more ECC-DIMMs, each such ECC-DIMM may be similar to the ECC-DIMM 10 in FIG. 1. Alternatively, in another embodiment, the ECC-DIMMs in the memory module 76 may have on-board error correction units configured to implement the error correction methodology according to the teachings of the present disclosure. In one embodiment, like the ECC-DIMM 10 in FIG. 1, each ECC-DIMM in the memory module 76 may include 9 chips—8 data chips plus one ECC chip. The ECC bits in a burst may be stored separately in an ECC-specific chip in a memory module as shown in case of the ECC-DIMM 10 in FIG. 1, or may be stored over more than one chip interleaved with data bits. In the latter case, all of the chips in the ECC-DIMM may be considered as "data chips" and there may be no dedicated ECC chip. The memory modules constituting the memory unit 76 may be, for example, any suitable type of system memory, such as, for example, Fully Buffered Dual Inline Memory Module (FB-DIMM), Rambus® DRAM, or the earlier-mentioned DDR/DDR2/DDR3/DDR4 SDRAM. The memory controller 77 may have the exemplary configuration shown in FIG. 6, which is discussed later. As noted earlier, in the present disclosure, the memory controller 77 is assumed to be operative to perform the methodologies discussed earlier with reference to FIGS. 3-4. However, as also mentioned before, in particular embodiments, the error correction scheme of the present disclosure may be implemented in the processor unit 74 or on-board an ECC-DIMM.

The CPU 80 may be a general purpose microprocessor. In the discussion below, the terms "processor" and "CPU" may be used interchangeably for ease of discussion. However, it is understood that, instead of or in addition to the CPU 80, the processor unit 74 may contain any other type of processor such as, for example, a microcontroller, a Digital Signal Processor (DSP), a Graphics Processing Unit (GPU), a dedicated Application Specific Integrated Circuit (ASIC) processor, and the like. Furthermore, in one embodiment, the processor unit 74 may include more than one CPUs, which may be operative in a distributed processing environment. The CPU 80 may be configured to execute instructions and to process data according to a particular Instruction Set Architecture (ISA) such as, for example, an x86 instruction set architecture (32-bit or 64-bit versions), a PowerPC® ISA, or a MIPS (Microprocessor without Interlocked Pipeline Stages) instruction set architecture relying on RISC (Reduced Instruction Set Computer) ISA.

It is known that, to reduce instruction execution time, modern CPUs store copies of frequently-used data into smaller, faster memories so as to avoid delays associated with accessing slower system memory—such as the memory 76—for data. These faster memories are referred to as "caches" that may co-exist with a CPU's core on the same chip, thereby significantly reducing data access time. The cache unit 79 may include such cache memories, which may be organized as a hierarchy of cache levels—i.e., Level 1 (or L1) cache, Level 2 (L2) cache, Level 3 (or L3) cache, and so on, with the lowest level cache (i.e., L1 cache) being accessed by the CPU 80 first before moving on to the next level of cache. If there is an L1 cache "hit" for a memory instruction, the associated data is returned to the execution units (not shown) in the processor 74. When the memory instruction "misses" in the L1 cache, a miss request is sent to the next (higher) level cache L2 or to the system bus (e.g., to access the system memory 76). Similarly, data may also written from a cache into the system memory 76. In any event, the system memory 76 may transfer data to/from the cache 79 as one or more "cache lines," each such cache line may be of 512 bits as discussed earlier.

In addition to storing cacheable data, the memory 76 may also receive and store data from a peripheral device, such as an Input/Output (I/O) device. The CPU 80 may be configured to coordinate transfers of such data between the system memory unit 73 and the peripheral device.

In one embodiment, different levels of cache memories may be arranged serially—i.e., L1 cache being accessed before an L2 cache, an L2 cache being accessed before an L3 cache, and so on. The actual placement of the various cache memories—for example, whether on the same CPU chip or not, whether as part of a CPU core not, etc.—is a design choice that may be dictated by a given processor's architecture, which is not relevant to the present disclosure.

FIG. 6 shows exemplary architectural details of the memory controller 77 depicted in the partial system configuration 70 of FIG. 5. For the sake of brevity, only the components relevant to the present disclosure are shown in FIG. 6 and discussed herein. The memory controller 77 may include a memory interface 82 and a processor interface 83, both operatively connected to a content buffer (simply, "buffer") 85. The memory interface 82 may be configured to manage the transfers of data between the memory module 76 and the processor unit 74. Such transfers of data include the earlier-described transfers of cache lines. For example, one or more cache lines may be read from the memory 76 by the memory controller 77 in response to cache fill requests to send data to the cache 79. The cache fill requests may be received by the memory controller 77 from the processor unit 74 through the processor interface 83. On the other hand, data "evicted" by the CPU 80 from the cache 79—such as when an earlier-stored cache line is to be replaced in the event of a cache "miss"—may be received through the processor interface 83 to be stored in the buffer 85 for eventual transfer to the memory 76 via the memory interface 82. Thus, cache lines to be sent to the cache 79 or to be written to the memory 76 may be temporarily stored in the content buffer 85. As mentioned earlier, the data may be read from or written into the memory 76 via multiple bursts constituting a single memory read or write operation.

In some embodiments, multiple instances of the memory interface 82 may be implemented, with each instance configured to control a respective bank of the system memory 76. The memory interface 82 may be configured to simultaneously support interfacing to multiple different types of system memory. The details of memory bank selection, row/column access, and data transfer to/from a memory bank in a memory chip (in the memory module 76) by the memory controller 77 are not relevant to the present disclosure, and hence are not discussed herein.

The memory controller 77 may also include a decoder or corrector unit 87 and an encoder unit 88. These units may be operatively coupled to the content buffer 85. All of the component units 82-83, 85, and 87-88 shown in FIG. 6 may be under the operational control of a control unit 90, which may also provide the necessary timing and control signaling to coordinate the operations of these units. During a memory read operation on the memory module 76, the control unit 90 may configure the memory interface 82 to store the cache line (512 bits) along with corresponding 64 bits of ECC into the content buffer 85. The control unit 90 may operate on the received memory content to generate the 128-bit overlapping codewords illustrated in the exemplary embodiment of FIG. 4. As part of this generation of 128-bit codewords, the control unit 87 may perform data mapping and data aggregation to enable application of the SECDED (128,120) code. In one embodiment, the decoder unit 87 may be configured to effectively operate on 120 bits, even if the decoder receives a total of 128 bits (data plus ECC). The control unit 90 may store one or more generated codewords in the buffer 85 or in an internal storage (not shown) within the control unit or within the decoder unit 87. Alternatively, the control unit 90 may generate one codeword at a time and let the decoder 87 operate on it before generating and supplying the next codeword to the decoder. In any event, when the decoder 87 operates on each codeword of 128 bits, the decoder 87 may use the SECDED (128,120) code to perform error correction and detection on the 120 bits of data—comprising the 64 bits of data received in a burst and 56 bits of "extended" data appended as discussed, for example, in the context of FIG. 4. The decoder 87 may be configured to correct the data errors as well, such as, for example, the errors shown in FIG. 4 and discussed earlier. Each decoded/corrected 64-bit data word (which will no longer include ECC bits) may be then stored in the content buffer 85 for eventual transfer to the cache memory 79 via the processor interface 83.

As noted before, the decoder 87 may continue to use existing SECDED-based decoding circuitry because of the usage of a SECDED code for error correction according to particular embodiments of the present disclosure. Hence, the design of the decoder 87 may be simplified.

Although the memory read operation is primarily discussed in the present disclosure, it is understood that the error correction scheme in the embodiments of FIGS. 3-4 equally applies to a memory write operation as well. For example, when a cache line is to be written to the memory 76, the memory controller 77 may receive 512 bits of cache line from the cache 79 through the processor interface 83. The received un-encoded data may be initially stored in the content buffer 85. In one embodiment, upon receipt of the cache line, the control unit 90 may divide the data into 8 segments of 64-bit each, for eventual writing into the memory 76 via 8 successive bursts. Prior to encoding each "original" 64-bit data word, in particular embodiments, the control unit 90 or the encoder 88 may append the data word with additional 56 data bits to extend the size of data bits to 120 bits under the SECDED (128,120) scheme. The appended data bits comprise the extended data portions 60 shown in the exemplary embodiment of FIG. 4. This data "extension" operation may be performed using appropriate data mapping or data aggregation approach. As in case of the memory read operation discussed above, the control unit 90 may store each 120-bit extended data segment in the buffer 85 or in an internal storage (not shown) within the control unit or within the encoder unit 88. Alternatively, the control unit 90 may generate one 120-bit data segment at a time and let the encoder 88 operate on it before generating and supplying the next data segment to the encoder 88. In one embodiment, when the encoder 88 operates on each data segment of 120 bits, the encoder 88 may use the SECDED (128,120) code to generate the corresponding 8 ECC bits for the relevant 120 bits of data. The encoder 88 may be configured to store the generated 8 ECC bits along with 64 bits of "original" data into the content buffer 85. As part of the memory write operation, the control unit 90 may then use a memory burst to store the burst-specific encoded data segment of 72 bits (64 bits of data plus 8 bits of ECC) to the memory module 76 via the memory interface 82. In a future memory read operation of a cache line as per the exemplary embodiments of FIGS. 3-4, these encoded data segments of 72 bits each may be received from the memory module 76 through the memory interface 82 and used as part of the SECDED (128,120) error correction scheme according to the teachings of the present disclosure.

In particular embodiments, the decoder and the encoder units 87-88 may be implemented as a single unit. In other embodiments, such a "combined" unit may be implemented as part of the control unit 90, in which case, many of the functionalities discussed above as being performed by the encoder/decoder units 87-88 may be effectively performed by the control unit 90. Alternatively, in one embodiment, it may be possible to configure individual decoder 87 and encoder 88 to perform some portion of control unit-specific functionality discussed earlier. However, in particular embodiments, the overall implementation of the error correction scheme of the present disclosure by the memory controller 77 may be more relevant than exactly which component or unit in the memory controller 77 performs what task.

Figure 7:
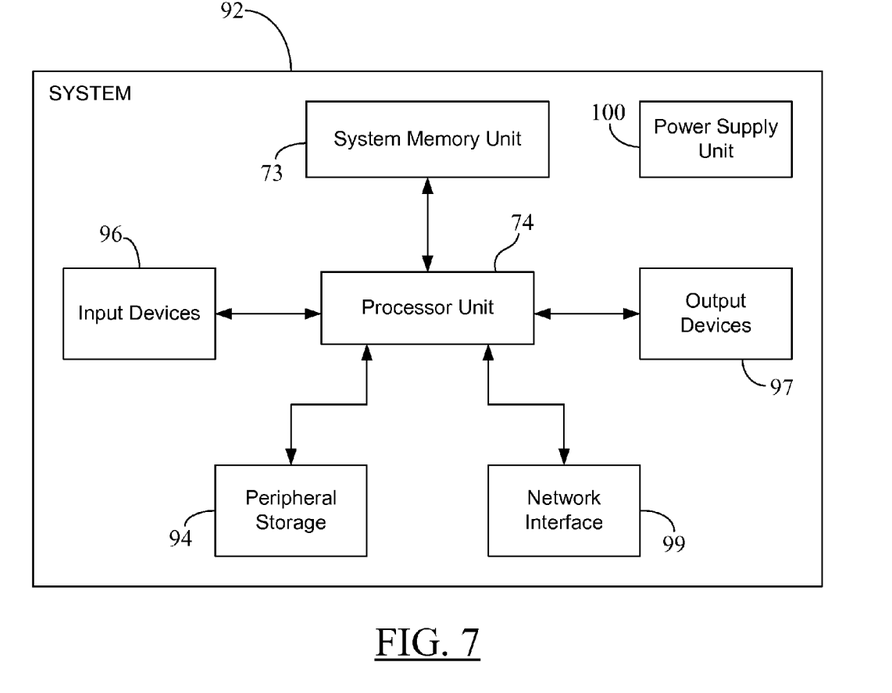
FIG. 7 depicts an exemplary system or apparatus that includes the system memory unit of FIG. 5 according to one embodiment of the present disclosure.

FIG. 7 depicts an exemplary system or apparatus 92 that includes the system memory unit 73 of FIG. 5 according to one embodiment of the present disclosure. Thus, in one embodiment, the partial configuration 70 in FIG. 5 may be considered as representative of the overall system 92 shown in FIG. 7. Hence, for ease of reference and discussion, the same reference numerals are used in FIGS. 5 and 7 for the common system components/units.

The memory unit 73 may include the memory controller 77 shown in the exemplary embodiment of FIG. 6 and configured to perform the error correction operations discussed earlier in the context of the exemplary embodiments of FIGS. 3-4. The memory controller 77 may be "configured" in hardware (and, to some extent, in software, if necessary) to accomplish multiple error corrections as per the inventive aspects of particular embodiments of the present disclosure. In other embodiments, instead of the memory controller 77, the processor unit 74 or the ECC-based memory modules in the system memory unit 73 (such as, for example, the ECC-DIMMs in the memory module 76 in FIG. 5) may be configured to implement the error correction methodology of the present disclosure as noted before. For example, in one embodiment, the processor unit 74 may include components similar to those shown in FIG. 6 (albeit in the context of the memory controller 77) to enable the processor 74 to store and operate on the content received from or to be sent to the memory module 76 using the SECDED (128,120) scheme of the present disclosure. Alternatively, in another embodiment, the system memory unit 73 may not include the memory controller 77, but, instead, the processor unit 74 may implement the functionality of the memory controller 77 discussed hereinbefore.

In FIG. 7, the processor unit 74 is shown coupled to the system memory 73 as well as to a peripheral storage unit 94, one or more input devices 96, one or more output devices 97, and a network interface unit 99. In some embodiments, the system 92 may include more than one instance of the devices or units shown. Some examples of the system 92 include a computer system (desktop or laptop), a tablet computer, a mobile device, a cellular phone, a video gaming unit or console, a machine-to-machine (M2M) communication unit, a stateless "thin" client system, or any other type of computing or data processing device. In various embodiments, the system 92 may be configured as a rack-mountable server system, a standalone system, or in any other suitable form factor. In some embodiment, the system 92 may be configured as a client system rather than a server system.

In particular embodiments, the processor unit 74 may include more than one CPUs, and/or the system 92 may include more than one processor units 74 (e.g., in a distributed processing configuration). When the system 92 is a multiprocessor system, there may be more than one instance of a CPU or processor.

In various embodiments, the system memory 73 may comprise any suitable type of memory as described earlier, such as FB-DIMM, DDR/DDR2/DDR3/DDR4 SDRAM, Rambus® DRAM, flash memory, and of various types of Read Only Memory (ROM), etc. In one embodiment, the system memory 73 may include multiple discrete banks of memory controlled by discrete memory interfaces. Also, in some embodiments, the system memory 73 may include multiple different types of memory, as opposed to a single type of memory.

The peripheral storage unit 94, in various embodiments, may include support for magnetic, optical, magneto-optical, or solid-state storage media such as hard drives, optical disks (such as CDs or DVDs), non-volatile RAM devices, etc. In some embodiments, the peripheral storage unit 94 may include more complex storage devices/systems such as disk arrays (which may be in a suitable RAID (Redundant Array of Independent Disks) configuration) or Storage Area Networks (SANs), which may be coupled to the processor 74 via a standard Small Computer System Interface (SCSI), a Fibre Channel interface, a Firewire® (IEEE 1394) interface, or another suitable interface. In one embodiment, the peripheral storage unit 94 may be coupled to the processor 74 via a standard peripheral interface such as, for example, the Peripheral Component Interface Express (PCI Express™) standard based interface, the Universal Serial Bus (USB) protocol based interface, or the IEEE 1394 (Firewire®) protocol based interface.

In particular embodiments, the input devices 96 may include standard input devices such as a computer keyboard, mouse or other pointing device, a touchpad, a joystick, or any other type of data input device. The output devices 97 may include a graphics/display device, a computer screen, an audio speaker, an alarm system, a CAD/CAM (Computer Aided Design/Computer Aided Machining) system, a video game station, or any other type of data output or process control device. In some embodiments, the input device(s) 96 and the output device(s) 97 may be coupled to the processor unit 74 via an I/O or peripheral interface(s).

In one embodiment, the network interface 99 may communicate with the processor unit 74 to enable the system 92 to couple to a network (not shown). In another embodiment, the network interface 99 may be absent altogether. The network interface 99 may include any suitable devices, media and/or protocol content for connecting the system 92 to a network—whether wired or wireless. In various embodiments, the network may include Local Area Networks (LANs), Wide Area Networks (WANs), wired or wireless Ethernet, telecommunication networks, or other suitable types of networks.

The system 92 may include an on-board power supply unit 100 to provide electrical power to various system components illustrated in FIG. 7. The power supply unit 100 may receive batteries or may be connectable to an AC electrical power outlet. In one embodiment, the power supply unit 100 may convert solar energy into electrical power.

Figure 8:
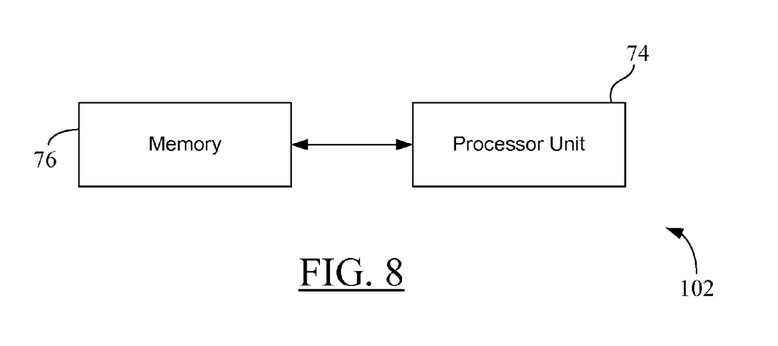
FIG. 8 illustrates an exemplary partial system configuration in which the error correction methodology shown in the embodiments of FIGS. 3-4 may be implemented.

FIG. 8 illustrates an exemplary partial system configuration 102 in which the error correction methodology shown in the embodiments of FIGS. 3-4 may be implemented. As shown in FIG. 8, the processor unit 74 may interface with the memory module 76 to implement the error correction methodology discussed herein. In contrast to the system layout in FIG. 5, in the embodiment of FIG. 8, the memory controller 77 may be absent because error correction as per teachings of the present disclosure is performed by the processor unit 74. Alternatively, in the embodiment of FIG. 8, the earlier-described functionality of the memory controller 77 may be implemented in the processor unit 74 to carry out error correction as discussed herein. As noted before, the processor 74 may include necessary storage to store memory data along with corresponding ECC bits retrieved from the memory 76 to perform the SECDED (128,120) based error correction during a memory read operation as per the teachings of the present disclosure. Similarly, during a memory write operation, the processor 74 may apply the SECDED (128,120) code to generate appropriate content for storage in the memory 76. Because of extensive discussion hereinbefore, additional discussion of FIG. 8 is not provided for the sake of brevity.

In the preceding description, for purposes of explanation and not limitation, specific details are set forth (such as particular architectures, interfaces, techniques, etc.) in order to provide a thorough understanding of the disclosed technology. However, it will be apparent to those skilled in the art that the disclosed technology may be practiced in other embodiments that depart from these specific details. That is, those skilled in the art will be able to devise various arrangements which, although not explicitly described or shown herein, embody the principles of the disclosed technology. In some instances, detailed descriptions of well-known devices, circuits, and methods are omitted so as not to obscure the description of the disclosed technology with unnecessary detail. All statements herein reciting principles, aspects, and embodiments of the disclosed technology, as well as specific examples thereof, are intended to encompass both structural and functional equivalents thereof. Additionally, it is intended that such equivalents include both currently known equivalents as well as equivalents developed in the future, e.g., any elements developed that perform the same function, regardless of structure.

Thus, for example, it will be appreciated by those skilled in the art that block diagrams herein (e.g., in FIGS. 5-8) can represent conceptual views of illustrative circuitry or other functional units embodying the principles of the technology. Similarly, it will be appreciated that the flow chart in FIG. 3 and the exemplary error correction illustration in FIG. 4 may represent various processes or innovative aspects which may be substantially performed by a memory controller (e.g., the memory controller 77 in FIGS. 5-6) with or without processing support from a processor (e.g., the processor unit 74 in FIGS. 5 and 7-8). The memory controller or the processor may include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Some or all of the functionalities described above in the context of FIGS. 3-4 may be provided in the hardware.

When certain inventive aspects require software-based processing, such software or program code may reside in a computer-readable data storage medium (not shown). Such data storage medium may be part of the peripheral storage 94 in the embodiment of FIG. 7, or may be part of the internal memory of the processor unit 74 or the memory controller 77 (FIGS. 5-6). The CPU 80 (FIG. 5) or the memory controller 77 may execute instructions stored on such a medium to carry out the software-based processing. The computer-readable data storage medium may be a non-transitory data storage medium containing a computer program, software, firmware, or microcode for execution by a general purpose computer or a processor mentioned above. Examples of computer-readable storage media include a Read Only Memory (ROM), a Random Access Memory (RAM), a digital register, a cache memory, semiconductor memory devices, magnetic media such as internal hard disks, magnetic tapes and removable disks, magneto-optical media, and optical media such as CD-ROM disks and Digital Versatile Disks (DVDs).

Alternative embodiments of the multiple error correction technique according to inventive aspects of the present disclosure may include additional components responsible for providing additional functionality, including any of the functionality identified above and/or any functionality necessary to support the solution as per the teachings of the present disclosure. Although features and elements are described above in particular combinations, each feature or element can be used alone without the other features and elements or in various combinations with or without other features. As mentioned before, the functions of some of the elements in the system 92—such as, for example, the memory controller 77 and the CPU 80—may be provided through the use of hardware (such as circuit hardware) and/or hardware capable of executing software/firmware in the form of coded instructions or microcode stored on a computer-readable data storage medium (mentioned above). Thus, such functions and illustrated functional blocks are to be understood as being either hardware-implemented and/or computer-implemented, and thus machine-implemented.

The foregoing describes an error correction scheme for an ECC-DIMM that uses SECDED (128,120) code along with data aggregation to correct more than one error in a memory word associated with a memory burst from the ECC-DIMM. By completely utilizing the Hamming distance of the SECDED (128,120) code, 8 ECC bits can be used to potentially correct one error in 120 data bits. Hence, 8 ECC bits are associated with not only their corresponding 64 data bits, but also with an additional 56 data bits from other memory bursts so as to have a total of 120 data bits per 8 bits of ECC. Each burst from the ECC-DIMM remains at 72 bits-64 data bits plus 8 bits of ECC. However, each memory burst is effectively "expanded" from its actual 64 data bits to 120 data bits by "sharing" data bits from all of the other bursts. In case of reading a cache line of 512 bits from the ECC-DIMM, the SECDED (128,120) code is used in conjunction with all the received 64 ECC bits to correct more than one error in the actual 64 bits of data in a memory word. The data mapping according to the teachings of the present disclosure may translate to a higher resilience or error correction than the existing (72,64) SECDED code. Furthermore, the error correction methodology according to the present disclosure does not require implementation of a new code and, hence, existing SECDED circuitry in a memory controller may be effectively used.

As will be recognized by those skilled in the art, the innovative concepts described in the present application can be modified and varied over a wide range of applications. Accordingly, the scope of patented subject matter should not be limited to any of the specific exemplary teachings discussed above, but is instead defined by the following claims.

What is claimed is:

1. A method comprising:
receiving a burst-specific content from each burst in a plurality of bursts from a memory module, wherein the burst-specific content includes a first pre-determined number of bits of burst-specific data along with corresponding bits of burst-specific Error Correcting Code (ECC), and wherein the first pre-determined number of bits and corresponding burst-specific ECC bits are received substantially simultaneously in a single transfer within a group of successive transfers from the memory module;
storing the burst-specific content from each burst in the plurality of bursts; and
using all received ECC bits from the plurality of bursts as part of a Single Error Correction Double Error Detection (SECDED) code to correct more than one error in the first pre-determined number of bits of burst-specific data from at least one of the plurality of bursts, wherein using all received ECC bits as part of the SECDED code includes:
for each burst in the plurality of bursts, selecting a burst-specific second pre-determined number of bits of data from all other bursts in the plurality of bursts, and
for each burst in the plurality of bursts, applying the corresponding bits of burst-specific ECC to the corresponding first pre-determined number of bits of burst-specific data as well as to the burst-specific second pre-determined number of bits of data.

2. The method of claim 1, wherein the SECDED code is a SECDED (128,120) code.

3. The method of claim 1, wherein the corresponding bits of burst-specific ECC include 8 bits of burst-specific ECC, and wherein a total of the first pre-determined number of bits and the second pre-determined number of bits is at least 120.

4. The method of claim 3, wherein selecting the burst-specific second pre-determined number of bits of data includes:
for each burst in the plurality of bursts, selecting an identical number of bits from the burst-specific data associated with each of the other bursts to generate the second pre-determined number of bits of data.

5. The method of claim 1, wherein the plurality of bursts is eight bursts.

6. The method of claim 1, wherein the first pre-determined number of bits is 64 bits.

7. The method of claim 1, wherein the memory module is an ECC Dual In-line Memory Module (ECC-DIMM).

8. The method of claim 1, further comprising:
receiving a data content to be stored in the memory module through a plurality of successive memory accesses;
dividing the data content into a plurality of access-specific data, wherein each access-specific data contains the first pre-determined number of bits;
for each access-specific data, selecting an additional third pre-determined number of bits of data from all other access-specific data in the plurality of access-specific data, wherein a total of the first pre-determined number of bits and the third pre-determined number of bits is at least 120;
for each memory access, applying the SECDED code to a combination of the access-specific data and associated additional third pre-determined number of bits of data to determine access-specific 8 bits of ECC; and
during each successive memory access, storing the access-specific data along with the access-specific 8 bits of ECC in the memory module.

9. The method of claim 8, wherein the plurality of successive memory accesses is eight accesses.

10. The method of claim 8, wherein selecting the additional third pre-determined number of bits of data includes:
for each access-specific data, selecting an identical number of bits from each of the other access-specific data to generate the additional third pre-determined number of bits of data.

11. A memory controller comprising:
a control unit;
a buffer coupled to the control unit, wherein the buffer is operative by the control unit to:
receive a burst-specific content from each burst in a plurality of bursts from a memory module, wherein the burst-specific content includes a pre-determined number of bits of burst-specific data along with corresponding bits of burst-specific Error Correcting Code (ECC), and wherein the pre-determined number of bits and corresponding burst-specific ECC bits are received substantially simultaneously in a single transfer within a group of successive transfers from the memory module, and
store the burst-specific content from each burst in the plurality of bursts; and
a decoder unit coupled to the buffer and the control unit, wherein the decoder unit is operative by the control unit to:
use all received ECC bits from the plurality of bursts as part of a Single Error Correction Double Error Detection (SECDED) (128,120) code to correct more than one error in the pre-determined number of bits of burst-specific data from at least one of the plurality of bursts,
wherein, for each burst in the plurality of bursts, the control unit is operative to:
select an identical number of bits from the burst-specific data associated with each of the other bursts to generate a burst-specific additional bits of data, wherein a total of the pre-determined number of bits and the burst-specific additional bits is at least 120, and
wherein, for each burst in the plurality of bursts, the decoder is further operative by the control unit to:
apply the burst-specific ECC bits to the corresponding pre-determined number of bits of burst-specific data as well as to the burst-specific additional bits of data.

12. The memory controller of claim 11, wherein the corresponding bits of burst-specific ECC include 8 bits of burst-specific ECC, and wherein the burst-specific additional bits of data include 56 bits of additional data for each burst in the plurality of bursts.

13. The memory controller of claim 11, wherein the pre-determined number of bits is 64 bits.

14. The memory controller of claim 11, wherein the memory module is an ECC Dual In-line Memory Module (ECC-DIMM).

15. The memory controller of claim 11, wherein the memory controller further comprises:
an encoder unit coupled to the buffer and the control unit, wherein the buffer is further operative by the control unit to:
receive a data content to be stored in the memory module through a plurality of successive memory accesses, wherein the control unit is further operative to:
divide the data content into a plurality of access-specific data, wherein each access-specific data contains the pre-determined number of bits, and
for each access-specific data, select an identical number of bits from each of the other access-specific data to generate an additional 56 bits of data, wherein a total of the pre-determined number of bits and the additional 56 bits is at least 120,
wherein, for each memory access, the encoder unit is operative by the control unit to:
apply the SECDED (128,120) code to a combination of the access-specific data and the associated additional 56 bits of data to determine access-specific 8 bits of ECC,
wherein, during each successive memory access, the control unit is further operative to:
store the access-specific data along with the access-specific 8 bits of ECC in the memory module.

16. The memory controller of claim 15, wherein the plurality of bursts is eight bursts, and wherein the plurality of successive memory accesses is eight accesses.

17. A system comprising:
a memory module configured to store electronic content; and
a processor coupled to the memory module and configured to perform a memory read operation on the memory module,
wherein, as part of the memory read operation, the processor is operative to perform the following:
receive a burst-specific content from each burst in a plurality of bursts from the memory module, wherein all bursts in the plurality of bursts together comprise the memory read operation, wherein the burst-specific content includes a first pre-determined number of bits of burst-specific data along with corresponding bits of burst-specific Error Correcting Code (ECC), and wherein the first pre-determined number of bits and corresponding burst-specific ECC bits are received substantially simultaneously in a single transfer within a group of successive transfers from the memory module for the memory read operation;
store the burst-specific content from each burst in the plurality of bursts,
use all received ECC bits from the plurality of bursts as part of a Single Error Correction Double Error Detection (SECDED) code to correct more than one error in the first pre-determined number of bits of burst-specific data from at least one of the plurality of bursts,
wherein, as part of using all the received ECC bits, the processor is further operative to perform the following for each burst in the plurality of bursts:
select a burst-specific second pre-determined number of bits of data from all other bursts in the plurality of bursts, wherein a total of the first pre-determined number of bits and the second pre-determined number of bits is at least 120, and
apply the bits of burst-specific ECC to the corresponding first pre-determined number of bits of burst-specific data as well as to the burst-specific second pre-determined number of bits of data.

18. The system of claim 17, wherein the processor is further configured to perform a memory write operation on the memory module, and
wherein, as part of the memory write operation, the processor is operative to perform the following:
prepare a data content to be stored in the memory module through a plurality of successive memory accesses, wherein all memory accesses in the plurality of successive accesses together comprise the memory write operation,
divide the data content into a plurality of access-specific data, wherein each access-specific data contains the first pre-determined number of bits,
for each access-specific data, select an additional third pre-determined number of bits of data from all other access-specific data in the plurality of access-specific data, wherein a total of the first pre-determined number of bits and the third pre-determined number of bits is at least 120,
for each memory access, apply the SECDED code to a combination of the access-specific data and associated additional third pre-determined number of bits of data to determine access-specific bits of ECC, and
during each successive memory access, store the access-specific data along with the access-specific bits of ECC in the memory module.

19. The system of claim 17, wherein the SECDED code is a SECDED (128,120) code.

* * * * *